(12) United States Patent
Lau

(10) Patent No.: US 8,302,301 B2
(45) Date of Patent: Nov. 6, 2012

(54) METHOD FOR BACKDRILLING VIA STUBS OF MULTILAYER PRINTED CIRCUIT BOARDS WITH REDUCED BACKDRILL DIAMETERS

(75) Inventor: Cheuk Ping Lau, YauMaTei (HK)

(73) Assignee: Flextronics AP, LLC, Broomfield, CO (US)

(*) Notice: Subject to any disclaimer, the term of this patent is extended or adjusted under 35 U.S.C. 154(b) by 8 days.

(21) Appl. No.: 13/042,601

(22) Filed: Mar. 8, 2011

(65) Prior Publication Data

US 2011/0240348 A1    Oct. 6, 2011

Related U.S. Application Data

(60) Provisional application No. 61/319,371, filed on Mar. 31, 2010.

(51) Int. Cl.
*H01K 3/10* (2006.01)
(52) U.S. Cl. .............. 29/853; 29/847; 174/262
(58) Field of Classification Search .......... 29/830, 29/846, 847, 853; 174/256, 262, 266; 216/41
See application file for complete search history.

(56) References Cited

U.S. PATENT DOCUMENTS

| | | | |
|---|---|---|---|
| 4,975,142 A * | 12/1990 | Iannacone et al. | 29/852 |
| 6,392,160 B1 * | 5/2002 | Andry et al. | 174/261 |
| 7,291,790 B2 * | 11/2007 | Bachar et al. | 29/847 |
| 7,337,537 B1 | 3/2008 | Smetana, Jr. | |
| 2007/0246252 A1 | 10/2007 | Buchwalter et al. | |
| 2009/0045889 A1 | 2/2009 | Goergen et al. | |
| 2009/0188710 A1 | 7/2009 | Senk | |

* cited by examiner

*Primary Examiner* — Donghai D. Nguyen
(74) *Attorney, Agent, or Firm* — Marsh Fischmann & Breyfogle LLP

(57) ABSTRACT

Methods of backdrilling printed circuit boards (PCBs) to remove via stubs and related apparatuses. The method may include removing a via stub through a combination of backdrilling and chemical etching. The backdrilling may remove a masking layer from the via stub. Portions of an underlying layer may remain in the region of the via stub after the backdrilling is completed. The remaining portions of the underlying layer may be removed in a subsequent etching process thereby removing the via stub from the PCB. As the backdrilling step may be used for the limited purpose of removing the outer layer and portions of the underlying layer remaining in the via can be tolerated, the diameter of the backdrilling need not be as large as traditional backdrilling where all layers within the via must be ensured of being completely removed.

13 Claims, 10 Drawing Sheets

METHOD FOR BACKDRILLING VIA STUBS OF MULTILAYER PRINTED CIRCUIT BOARDS WITH REDUCED BACKDRILL DIAMETERS

CROSS-REFERENCE TO RELATED APPLICATION

This application claims priority under 35 U.S.C. 119 to U.S. Provisional Application No. 61/319,371, entitled: "BACKDRILLING OF MULTILAYER PRINTED CIRCUIT BOARDS," filed on Mar. 31, 2010, the contents of which are incorporated herein by reference as if set forth in full.

BACKGROUND

Typically, a printed circuit board (PCB) contains a plurality of vias, each electrically connecting a conductive trace on one layer of the PCB to one or more conductive traces on one or more other layers of the PCB. Some vias may be interconnected such that a portion of the via is not disposed along a conductive of the PCB. For example, where a via interconnects two internal layers of the PCB, the portion of the via extending from an outermost one of the internal layers to a surface of the PCB is referred to as a via stub. Via stubs serve no useful function in the circuit of the PCB and may cause signal distortion and/or other problems.

Backdrilling is a technique used to remove a via stub. Backdrilling uses controlled depth drilling techniques to remove the undesired conductive plating in the via stub region. Typically, the via stub region is removed using a drill bit larger in diameter than the drill bit that was used to create the original via hole. While such backdrilling may eliminate many of the problems associated with via stubs, the larger drill bit produces a hole larger than the original via which negatively impacts i) the clearance requirements for signal traces for each layer through which the backdrilled hole passes and ii) the minimum via-to-via spacing.

SUMMARY

In an aspect, a method of backdrilling a via of a printed circuit board (PCB) includes drilling a through hole through the PCB to form the via, the via having a first diameter and an inner surface, and depositing a first layer of a first material on the inner surface. The method further includes, after depositing the first layer, depositing a second layer of a second material on the first layer that is on the inner surface. After depositing the second layer, the method includes backdrilling a portion of the via such that the second layer is removed from the portion and such that at least some of the first layer is remaining in the portion, and then chemically removing the at least some of the first layer remaining in the portion.

The PCB may include a plurality of layers of glass reinforced epoxy laminate. The depositing of the first layer may include electrically interconnecting with the first layer first and second conductive portions. The first and second conductive portions may be disposed at different locations of the PCB along a length of the via (e.g., the first and second conductive portions may be conductive traces disposed between layers of the PCB). In an embodiment, the first diameter may be less than 11 mils. In an embodiment, the backdrilling may be of a second diameter that is less than the first diameter plus 5 mils. In another embodiment, the second diameter may be less than the first diameter plus 3 mils. In another embodiment, the second diameter may be less than or equal to the first diameter.

In an arrangement, the first material may include copper and the second material may include tin. The chemically removing step may be performed with an etchant operable to etch the first material at a first rate and etch the second material at a second rate. The first rate may be greater than the second rate, thus, for example, enabling the selective removal of portions of the first material by the etchant. The method may include maintaining a passageway free from obstruction through the via after the chemically removing step. The method may include removing an entirety of the second layer from the inner surface.

In another aspect, a PCB includes a first substrate, a plurality of vias through the first substrate, a first plating layer, and a second plating layer. The first substrate includes first and second approximately parallel surfaces where a separation distance between the first and the second surface defines a thickness of the first substrate. The first substrate comprises a plurality of layers laminated together. The plurality of vias extends from the first surface, through the first substrate, to the second surface. A length of a first via of the plurality of vias extends from the first surface to the second surface, and the first via includes first and second portions along the length.

The first plating layer covers an entirety of the first portion and at least partially covers the second portion. The second plating layer covers an entirety of the first plating layer covering an entirety of the first portion, while the second portion is free of the second plating layer. The chemical composition of the first plating layer is different than the chemical composition of the second plating layer. Such a configuration, for example, represents a stage of a manufacturing process where the second plating layer has been fully removed from the second portion by backdrilling and thus will allow any portions of the first layer remaining in the second portion to be etched away by an etchant.

In an embodiment, the first plating layer may electrically connect a first conductive member disposed between first and second layers of the plurality of layers to a second conductive member disposed in a location other than between the first and second layers. A passageway clear of obstruction may pass through the first portion and the second portion. The first plating layer may include copper and the second plating layer may include tin.

In another aspect, a PCB includes a first substrate, a plurality of vias extending through the first substrate, and a plating covering an entirety of a first portion of a length of a first via of the plurality of vias, while a second portion of the length of the first via is free of the plating. The first substrate includes first and second surfaces that are approximately parallel to each other and the distance between them defines a thickness of the first substrate. The first substrate comprises a plurality of layers laminated together. The diameter of the second portion is less than 5 mils larger than the diameter of the first portion. The plating electrically connects a first conductive member disposed between first and second layers of the plurality of layers to a second conductive member disposed in a location other than between the first and second layers.

DETAILED DESCRIPTION

Figure 1:
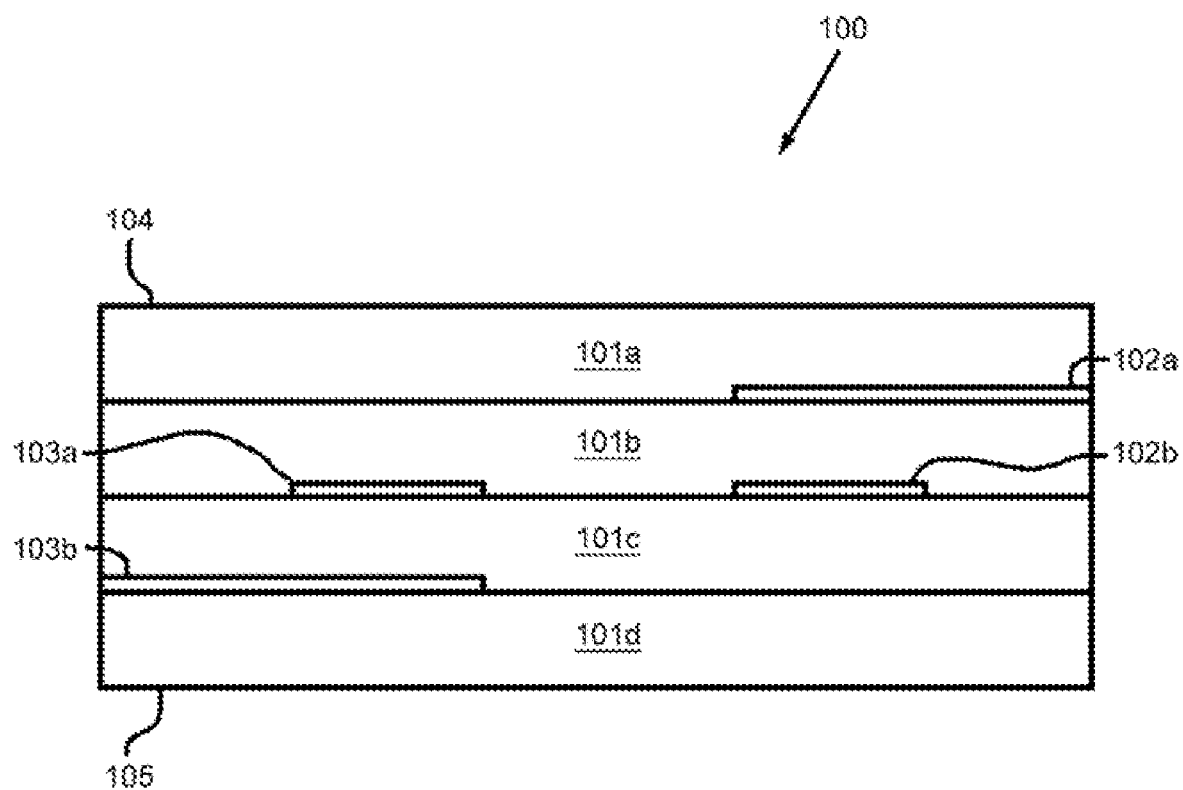
FIG. 1 is a cross sectional schematic illustration of a PCB prior to drilling.

While the invention is susceptible to various modifications and alternative forms, specific embodiments thereof have been shown by way of example in the drawings and are herein described in detail. It should be understood, however, that it is not intended to limit the invention to the particular form disclosed, but rather, the invention is to cover all modifications, equivalents, and alternatives falling within the scope and spirit of the invention.

Embodiments described herein may include PCBs in various stages of manufacture, and related methods of fabrication of PCBs. For example, a method of removing a via stub through a combination of backdrilling and chemical etching includes backdrilling the via to remove a masking layer from the via stub. Portions of an underlying layer (e.g., a conductive layer used to form conductive pathways) may remain in the region of the via stub after the backdrilling is completed. The remaining portions of the underlying layer may be removed in a subsequent etching process, thereby removing the via stub from the PCB. The backdrilling step may be used for the limited purpose of removing the outer layer, and portions of the underlying layer remaining in the via can be tolerated. The diameter of the backdrilling need not be as large as traditional backdrilling where all layers within the via must be ensured of being completely removed. Thus the PCBs and related methods described herein allow for smaller backdrilling diameters and therefore tighter clearances between backdrilled vias and surrounding structures as compared to traditional backdrilling.

FIG. 1 illustrates a cross section of an embodiment of a PCB 100 that includes a plurality of layers 101a-101d laminated together. Although four layers are illustrated, any appropriate number of layers may be used to form the PCB 100. Conductive traces, such as conductive traces 102a, 102b and conductive traces 103a, 103b may be disposed at various locations between the various layers of the plurality of layers 101a-101d. The PCB 100 includes an upper surface 104 and a lower surface 105. As used herein, terms such as "upper" and "lower" are used to describe relative positioning of various portions of the PCB 100 as illustrated in the accompanying figures. In actual use, the PCB 100 may be placed in any appropriate orientation. The PCB 100 may be constructed from any appropriate material, including, for example, a glass reinforced epoxy laminate such as FR-4.

In the exemplary method of fabricating the PCB 100 illustrated in FIGS. 1 through 7, it is desired to interconnect conductive traces 100a, 102b to conductive traces that will be placed on the upper surface 104 of the PCB 100 and the a lowers surface 105 of the PCB. Also, in the fabrication method and PCB 100 illustrated in FIGS. 1 through 7, it is desired to interconnect conductive traces 103a and 103b to conductive traces that will be placed on the lower surface 105 of the PCB 100. Accordingly, any extension of a plated via that extends upward from the conductive trace 103a will be an undesirable via stub.

Figure 2:
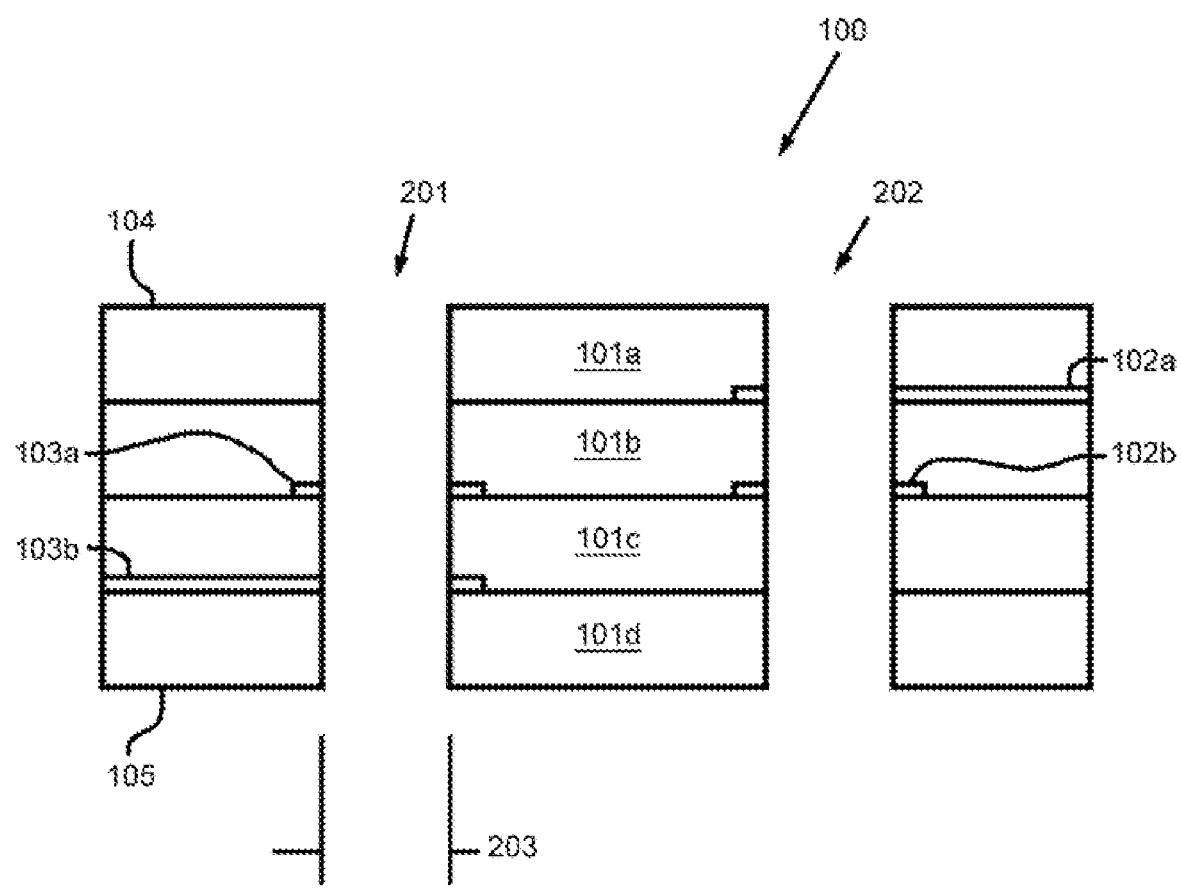
FIG. 2 is a schematic illustration of the PCB of FIG. 1 after drilling.

FIG. 2 illustrates the PCB 100 after first and second holes 201, 202 have been drilled therethrough. The first and second holes 201, 202 have been drilled through corresponding areas of the conductive traces 102a, 102b, 103a, and 103b in preparation for creating electrical interconnects as will be shown. The first hole 201 may have a first hole diameter 203. The first hole diameter 203 may, for example, equal 10 mils. The second hole 202 may have the same diameter as the first hole 201 or it may be of any other appropriate diameter.

Figure 3:
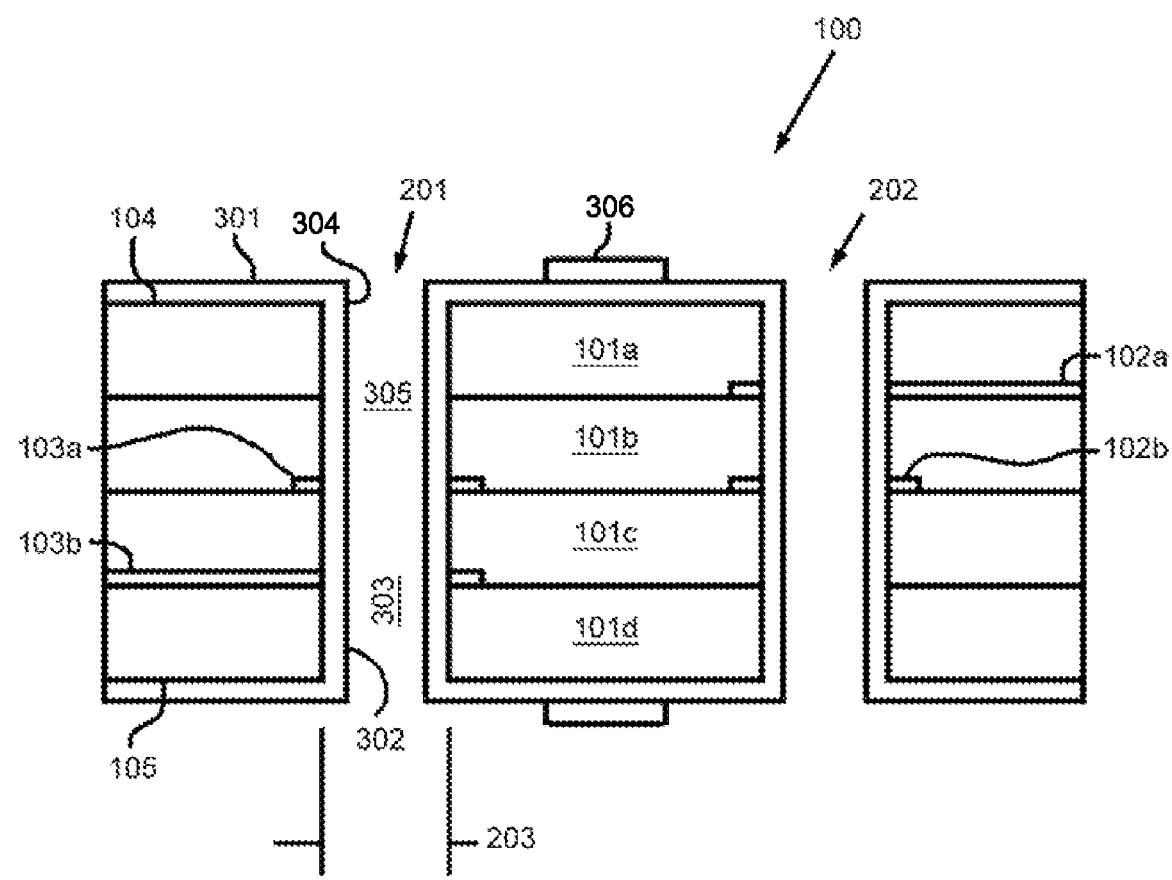
FIG. 3 is a schematic illustration of the PCB of FIG. 1 after a plating operation.

FIG. 3 illustrates the PCB 100 after it has been plated with a conductive layer 301 (e.g. copper). As illustrated, the conductive layer 301 covers all exposed surfaces of the PCB 100 including the interior surfaces of the first and second holes 201, 202. It will be appreciated that the conductive layer 301 as illustrated in FIG. 3 electrically interconnects all of the conductive traces 102a, 102b, 103a, and 103b, that intersect the first and second holes 201, 202. In this regard, within the first hole 201a desired interconnect portion 302 of the conductive layer 301 is formed in a lower portion 303 of the first hole 201, and a via stub 304 is formed in an upper portion 305 of the first hole 201. The desired interconnect portion 302 extends from the conductive trace 103a downward to the lower surface 105 of the PCB 100. The via stub portion 304 extends from the conductive trace 103a upwardly to the upper surface 104.

After deposition of the conductive layer 301, a first masking layer 306 may be applied to the conductive layer 301 in areas where, subsequently, the conductive layer 301 is to be removed from the PCB 100. The first masking layer 306 may be formed using any appropriate method known to those skilled in the art (e.g., using a photographic process). The first masking layer 306 may be comprised of any appropriate material.

Figure 4:
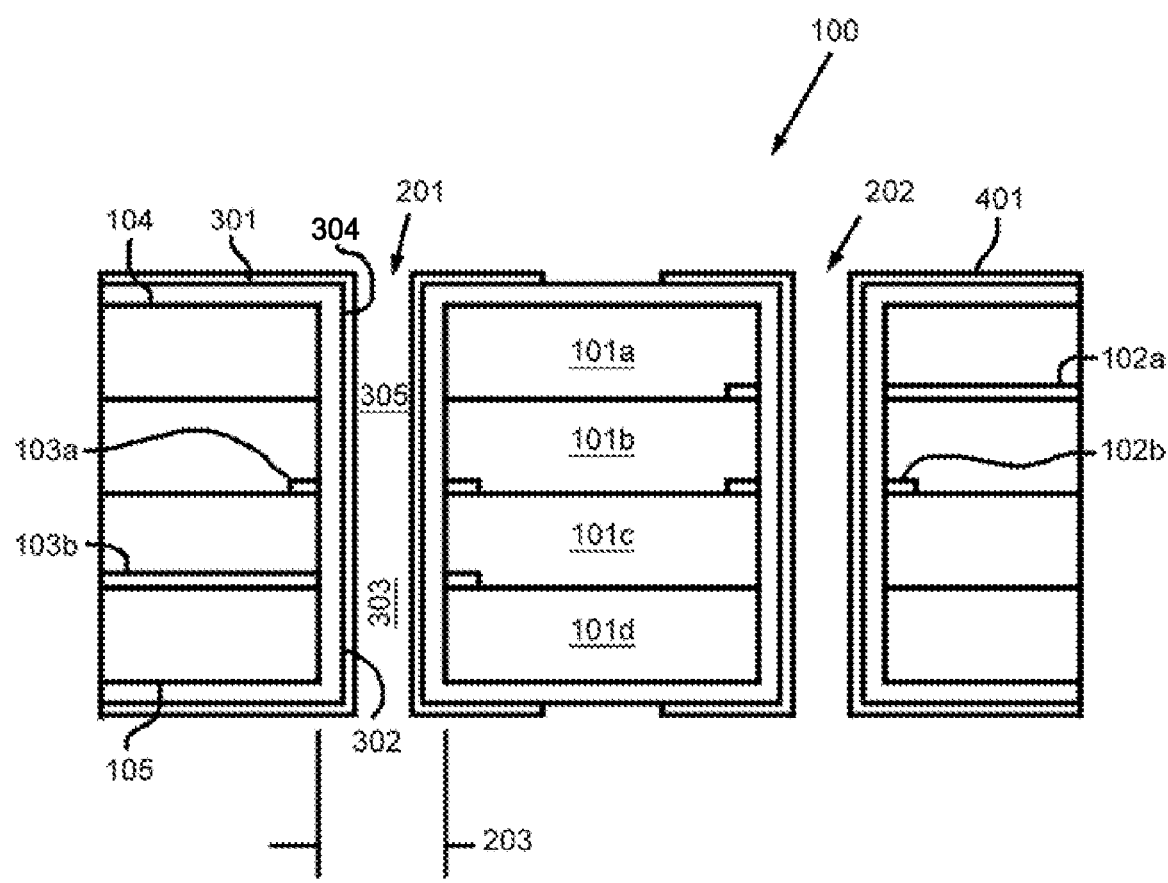
FIG. 4 is a schematic illustration of the PCB of FIG. 1 after the application of an etch mask layer.

FIG. 4 illustrates the PCB 100 after an etch mask layer 401 has been deposited onto the PCB 100 and the first masking layer 306 has been removed. Thus, the etch mask layer 401 is disposed on top of the conductive layer 301 in a pattern that is the negative of the pattern of the first masking layer 306. Consequently, the etch mask layer 401 is covering those portions of the conductive layer 301 which are desired to remain on the PCB 100. The etch mask layer 401 may, for example, include tin. Tin may be used because of its ability to it adhere to copper and to resist etching in the presence of a copper etchant.

Figure 5A:
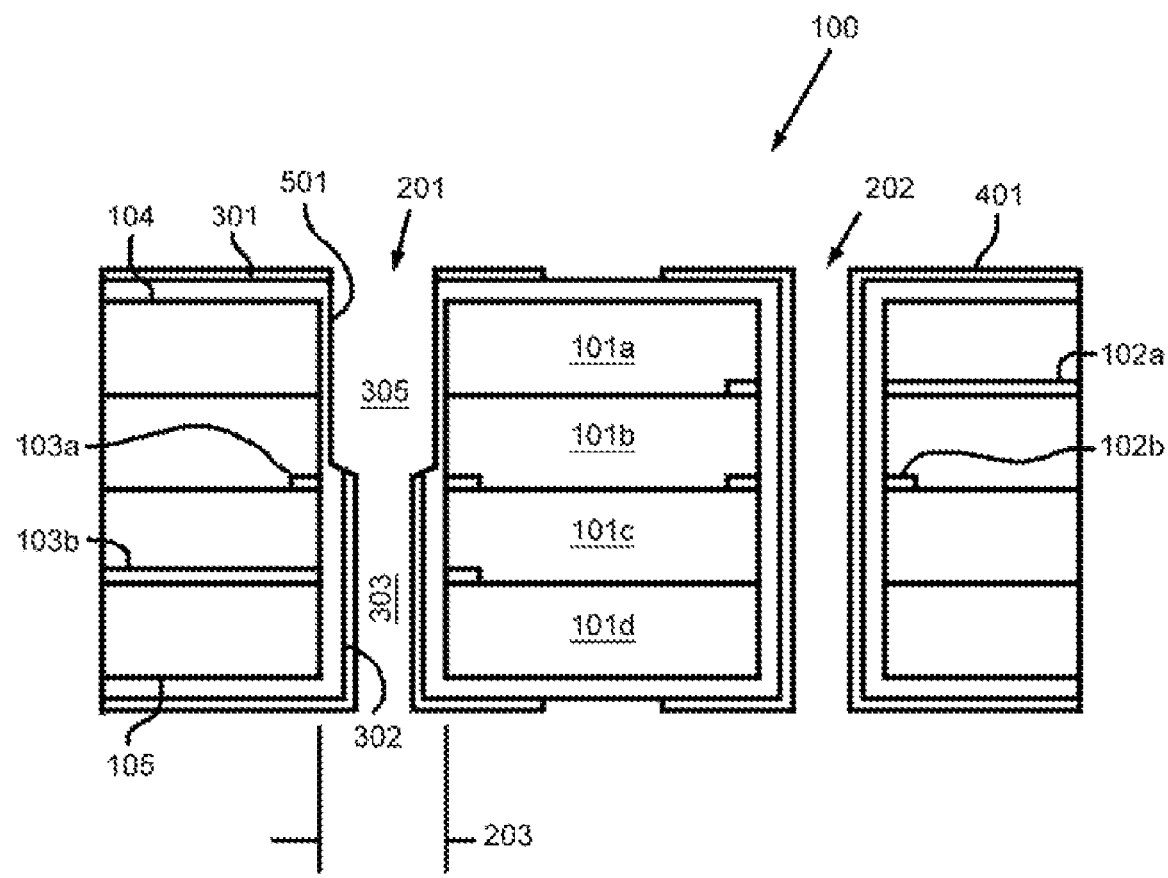
FIGS. 5a through 5c are schematic illustrations of the PCB of FIG. 1 after backdrilling.

FIG. 5a illustrates the PCB 100 after the via stub 304 has been backdrilled by drilling along the first hole 201 through the upper surface 104 to a controlled depth. The controlled depth is selected such that a backdrilled portion 501 does not extend below the conductive trace 103a and the desired interconnect portion 302 remains electrically interconnected to the conductive trace 103a. In the embodiment of FIG. 5a, the drill bit for backdrilling the via stub 304 was slightly smaller in diameter than the original first hole diameter 203. Thus, a portion of the conductive layer 301 remains in the region of the upper portion 305. However, an entirety of the etch mask layer 401 has been removed upper portion 305, thus enabling a subsequent etch of the conductive layer 301 to remove an entirety of the conductive layer 301 from the upper portion 305.

Figure 5B:
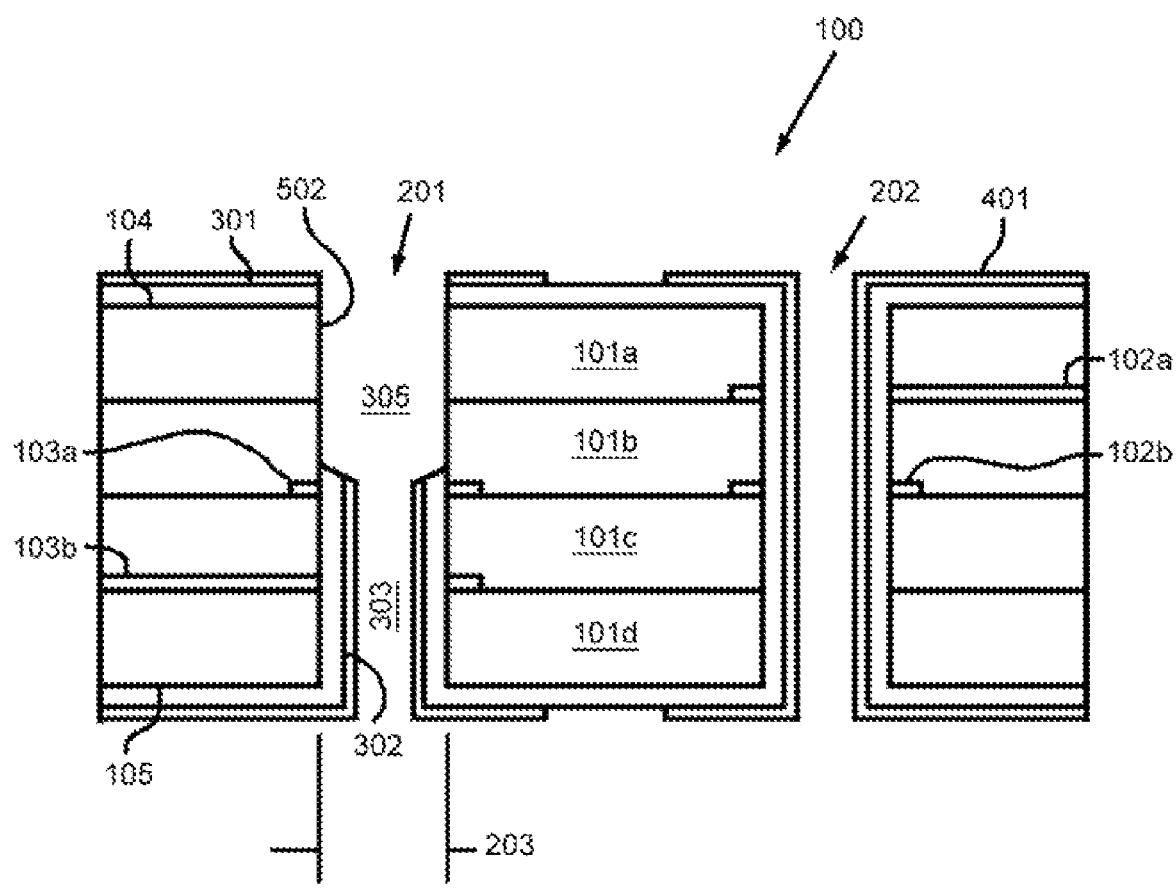

In an alternate embodiment to that illustrated in FIG. 5a, FIG. 5b illustrates the PCB 100 after the via stub 304 has been backdrilled using a bit that is equal in diameter to the first hole diameter 203. In such an embodiment, due to potential misalignment between the drill bit used for backdrilling and the first hole 201, some material from the conductive layer 301 may remain within the first hole 201 along the upper portion 305 thereof along a surface 502 of the upper portion 305. However, an entirety of the etch mask layer 401 has been removed from upper portion 305, thus enabling a subsequent etch of the conductive layer 301 to remove an entirety of any remaining material of the conductive layer 301 disposed along the upper portion 305.

Figure 5C:
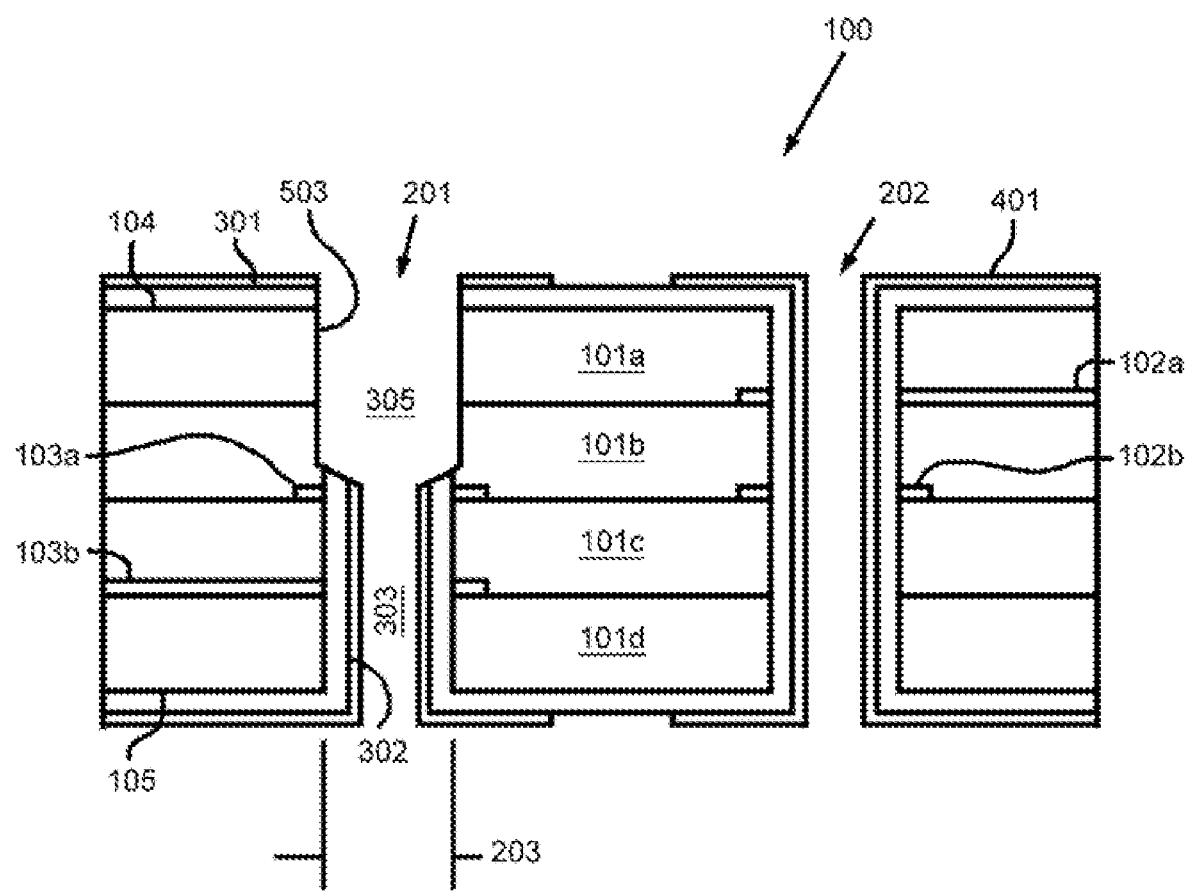

In another alternate embodiment, FIG. 5c illustrates the PCB 100 after the via stub 303 has been backed drilled using a drill bit that is slightly larger in diameter than the drill bit used to create the first hole 201. In this embodiment, the backdrilling process has removed some material from the first 101a and second 101b layers of the PCB 100. However, misalignment between the drill bit used to for the backdrilling and the first hole 201 may result in the backdrilled portion being misaligned with the first hole 201 such that a portion of the conductive layer 301 may remain within the first hole 201 along the upper portion 305 thereof along a surface 503 of the upper portion 305. However, an entirety of the etch mask layer 401 has been removed from upper portion 305, thus enabling a subsequent etch of the conductive layer 301 to remove an entirety of any remaining material of the conductive layer 301 disposed along the upper portion 305.

One or more protective layers may be temporarily placed over the upper and/or lower surfaces 104, 105 of the PCB 100 during the backdrilling operation. The protective layers may serve to protect the etch mask layer 401 from scratches during the process of backdrilling and associated PCB 100 handling. For example, 0.2 mm phenolic sheets may be placed over the upper and lower surfaces 104, 105 during the backdrilling process. To locate the tool for backdrilling, an x-ray drilling system may be used. After backdrilling, the PCB 100 may go through a high pressure rinse step to remove any material that may be blocking the vias (e.g., that may result from the backdrilling process).

Figure 6:
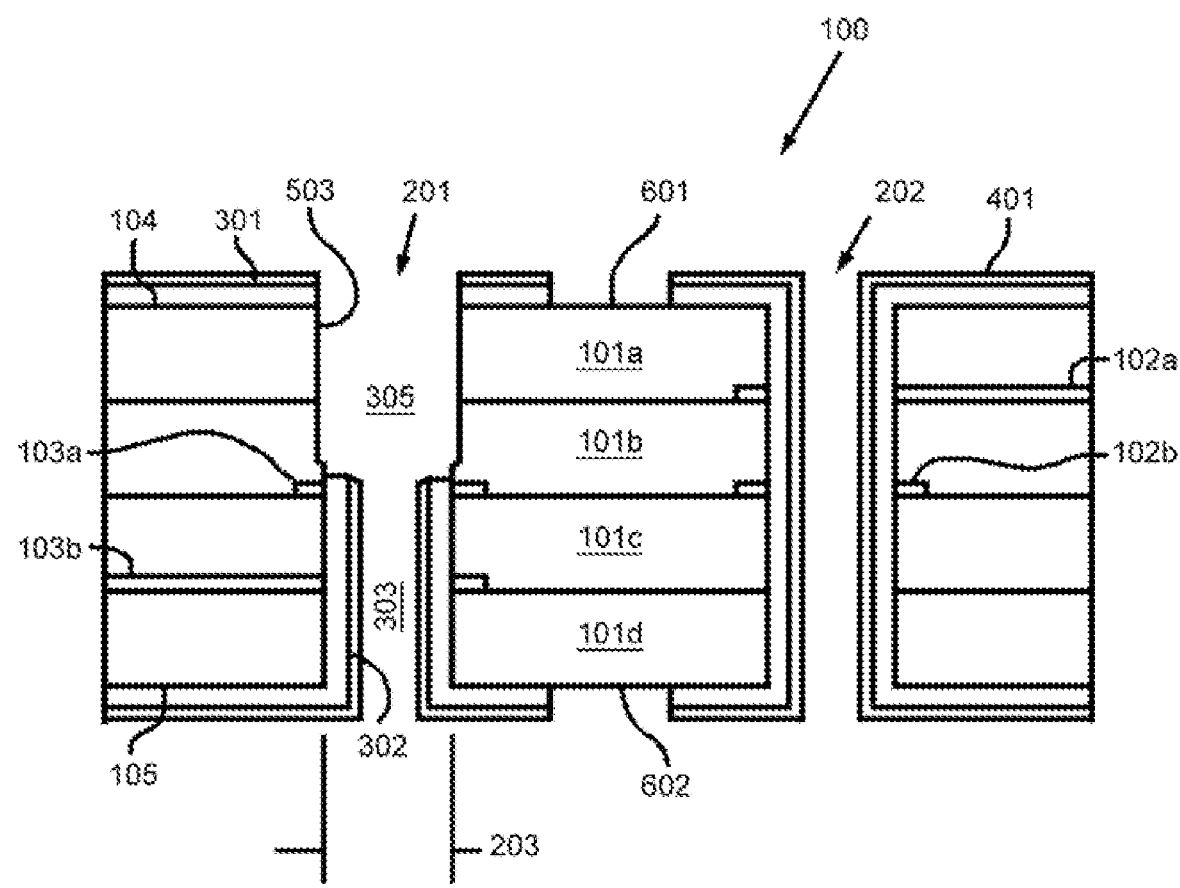
FIG. 6 is a schematic illustration of the PCB of FIG. 5c after an etching operation.

After backdrilling is performed as illustrated in FIG. 5a, 5b or 5c, a next step in the fabrication process may be to expose the PCB 100 to an etchant capable of selectively etching the conductive layer 301. Using the PCB of FIG. 5c as an example, after such exposure to etchant, the PCB 100 of the embodiment of FIG. 5c may appear as illustrated in FIG. 6. The regions formerly occupied by the first masking layer 306 were exposed to the etchant and therefore the conductive layer 301 has been removed from those areas, such as areas 601 and 602. Furthermore, where the etch mask layer 401 was removed during backdrilling, any exposed material from the conductive layer 301 within upper portion 305 has been removed therefore completely removing the via stub 304 from the upper portion 305.

Figure 7:
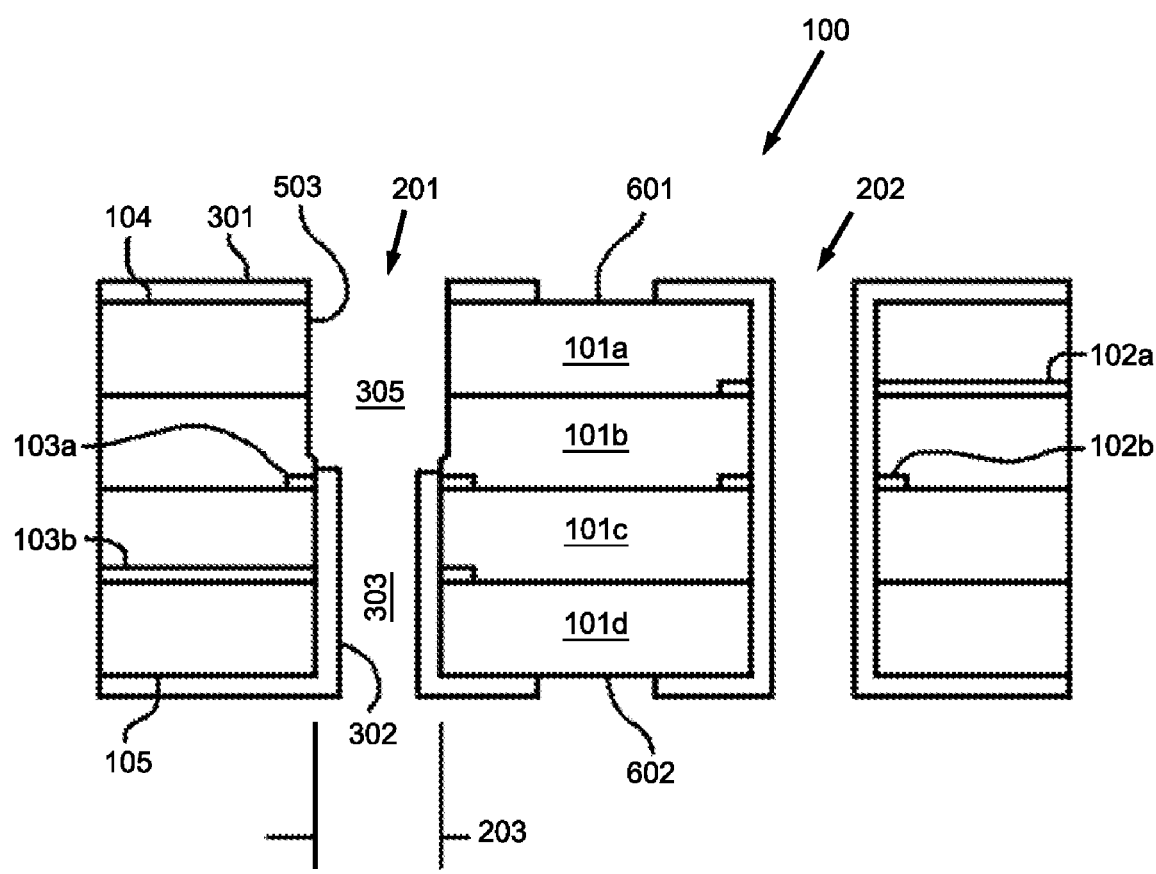
FIG. 7 is a schematic illustration of the PCB of FIG. 5c after the etch mask layer has been removed.

The next step may be to remove the etch mask layer 401 thus producing the PCB 100 as illustrated in FIG. 7. The first hole 201 includes the upper portion 305 free from any material of the conductive layer 301. Additionally the first hole 201 includes the desired interconnect portion 302 containing a portion of the conductive layer 301 interconnecting the conductive trace 103a, the conductive trace 103b, and the portion of the conductive layer 301 disposed on the lower surface 105.

A significant advantage over traditional backdrilling is that the backdrilling described herein need not ensure removal of the entirety of the conductive layer 301. The backdrilling need only remove the etch mask layer 401, thus allowing for a relatively smaller drill bit to be used for backdrilling. Consequently, the backdrilling procedure described herein can be performed such that less surface area of the PCB 100 is used than in a traditional backdrilling process.

After the removal of the conductive layer 301 from the upper portion 305, the processing of the PCB 100 may continue using any appropriate processes.

Figure 8:
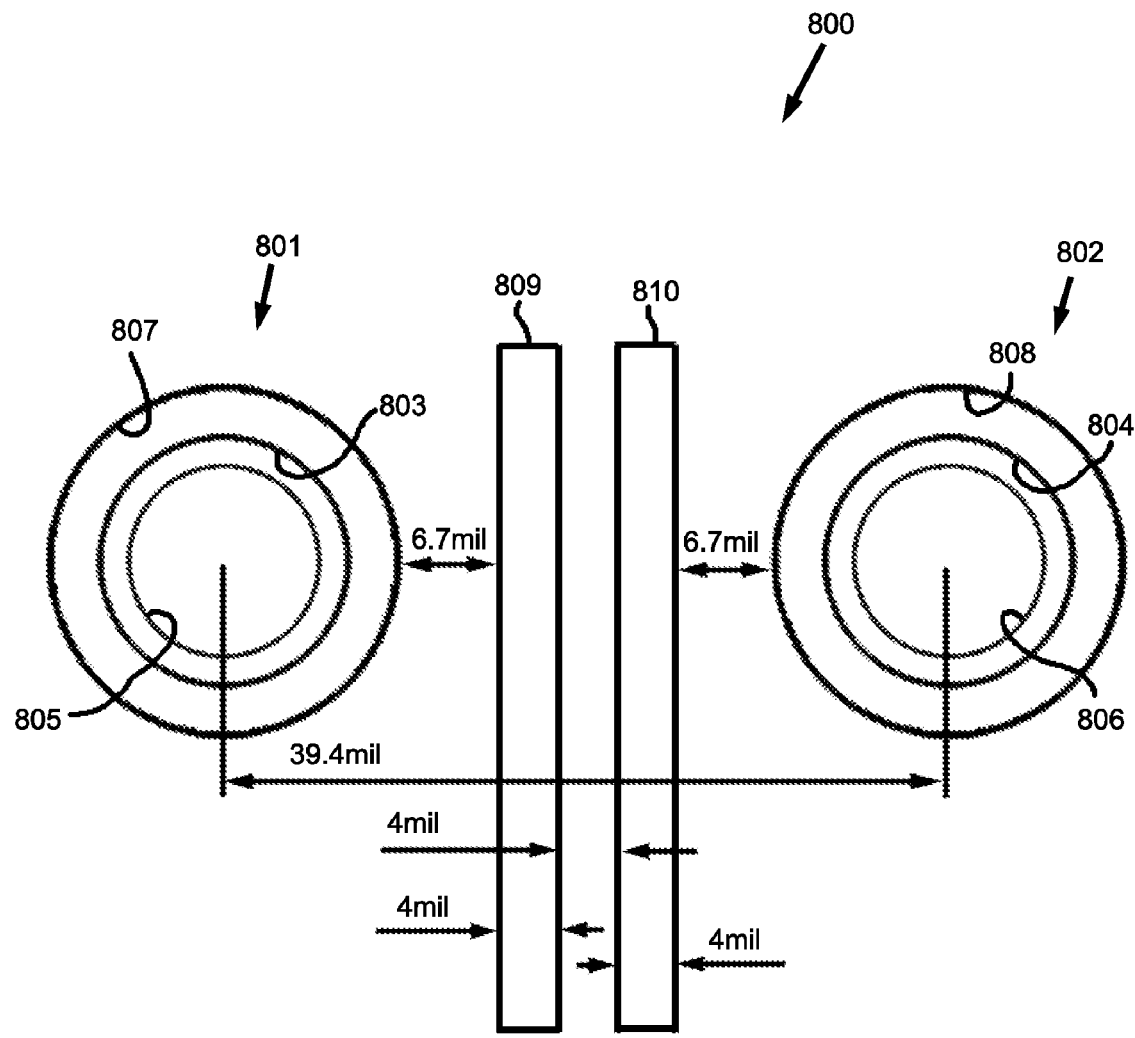
FIG. 8 is a top view schematic illustration of the PCB of FIG. 7.

FIG. 8 is a top view schematic diagram 800 showing spacing between a first via 801 and a second via 802 created according to methods described herein. The first and second vias 801, 802 include first and second through holes 803, 804, respectively. Within the first and second vias 801, 802 are first and second interconnect portions 805, 806, respectively, that electrically interconnect two or more conductive traces of the PCB. Each of the through holes 803, 804 has been backdrilled with a drill bit larger than the diameter of the through holes 803, 804 to produce backdrilled portions 807, 808, respectively.

In the exemplary embodiment of FIG. 8, the center-to-center spacing of the first and second through holes 802, 803 is 39.4 mils (1 mm). Such center-to-center spacing may be used such that the vias will be on a spacing that matches the pitch between connectors of a particular component. For example, a common spacing for electronic components using a ball grid array (BGA) is 1 mm. Thus, the embodiment of FIG. 8 may be applicable for connection to a BGA device where individual balls of the BGA may align with, and subsequently be electrically interconnected to, the vias of the embodiment of FIG. 8.

The first and second through holes 802, 803 are each 10 mils in diameter and the backdrilled portions 807, 808 are each 14 mils in diameter. Thus the minimum nominal spacing between the backdrilled portions 807, 808 is 25.4 mils. Also shown in FIG. 8 are first and second traces 809, 810. Each trace is 4 mils wide and the traces 809, 810 are spaced 4 mils apart. Thus, the traces 809, 810 and the spacing therebetween take up 12 mils of the 25.4 mils between the backdrilled portions 807, 808, leaving 13.4 mils of clearance between the backdrilled portions 807, 808 and the traces 809, 810. Thus the nominal spacing between the first backdrilled portion 807 and the first trace 809 is 6.7 mils, and the nominal spacing between the second backdrilled portion 808 and the second trace 810 is also 6.7 mils.

In another embodiment, the backdrilled portion may be 12 mils in diameter. In such an embodiment, the nominal spacing between the backdrilled portions and the traces 809, 810 may be 7.7 mils. In still another embodiment, the backdrilled portion may be 10 mils in diameter resulting in the nominal spacing between the backdrilled portions and the traces 809, 810 being 9.7 mils. The drilling in such an embodiment may be similar to a reaming operation to remove the etch mask layer 401 from the upper portion 305. Any other appropriate backdrill diameter may be used.

Known backdrilling techniques, where the backdrilling is required to remove all of the conductive material of the via stub, require larger backdrilling portions, such as 16 mils. In the embodiment of FIG. 8, 16 mil backdrilling would reduce backdrilled hole-to-trace clearance to 5.7 mils. The risk of the backdrilling cutting into the traces 809, 810 is significantly greater where the clearance is 5.7 mils as compared to the embodiment of FIG. 8 where the clearance is 6.7 mils. Thus the embodiment of FIG. 8 represents a significant improvement and enables backdrilled holes to be incorporated into vias used in interconnecting to BGA devices with a 39.4 mil (1 mm) pitch.

FIG. 8 is an exemplary configuration that highlights how the embodiments described herein may enable the use of backdrilling techniques in PCBs where backdrilling was previously not practical. It should be understood that the backdrilling techniques described herein may be used in other appropriate PCBs and is not limited to PCBs incorporating components with 1 mm spaced BGA components. Indeed, the methods described herein may allow for denser PCBs over known backdrilling techniques wherever they may be implemented.

While the invention has been illustrated and described in detail in the drawings and foregoing description, such illustration and description is to be considered as exemplary and not restrictive in character. For example, certain embodiments described hereinabove may be combinable with other described embodiments and/or arranged in other ways (e.g., process elements may be performed in other sequences). Accordingly, it should be understood that only the preferred embodiment and variants thereof have been shown and described and that all changes and modifications that come within the spirit of the invention are desired to be protected.

The invention claimed is:

1. A method of backdrilling a via of a printed circuit board (PCB), said method comprising:
    drilling a through hole through said PCB to form said via, wherein said via having a first diameter, wherein said via comprises an inner surface;
    depositing a first layer of a first material on said inner surface;
    after depositing said first layer, depositing a second layer of a second material on said first layer on said inner surface;
    after depositing said second layer, backdrilling a portion of said via such that said second layer is removed from said portion and such that at least some of said first layer is remaining in said portion;
    chemically removing said at least some of said first layer remaining in said portion; and removing at least an entirety of said second layer from the first layer on the inner surface.

2. The method of claim 1, wherein said PCB comprises a plurality of layers of glass reinforced epoxy laminate.

3. The method of claim 1, wherein said depositing a first layer comprises electrically interconnecting with said first layer first and second conductive portions, wherein said first and second conductive portions are disposed at different locations of said PCB along a length of said via.

4. The method of claim 1, wherein said first diameter is less than 11 mils.

5. The method of claim 1, wherein said backdrilling having a second diameter, wherein the second diameter is less than a sum equal to 5 mils plus the first diameter.

6. The method of claim 5, wherein said second diameter is less than or equal to said first diameter.

7. The method of claim 1, wherein said backdrilling having a second diameter, wherein the second diameter is less than a sum equal to 3 mils plus the first diameter.

8. The method of claim 7, wherein said second diameter is less than or equal to said first diameter.

9. The method of claim 1, wherein said backdrilling having a second diameter that is less than or equal to said first diameter.

10. The method of claim 1, wherein said first material comprises copper and said second material comprises tin.

11. The method of claim 1, wherein said chemically removing step is performed with an etchant operable to etch said first material at a first rate, wherein said etchant is operable to etch said second material at a second rate, wherein said first rate is greater than said second rate.

12. The method of claim 1, further comprising maintaining a passageway free from obstruction through said via after said chemically removing step.

13. The method of claim 1, wherein said PCB comprises a plurality of layers of glass reinforced epoxy laminate, wherein said first diameter is less than 11 mils, wherein said first material comprises copper, wherein said depositing a first layer comprises electrically interconnecting with said first layer first and second conductive portions, wherein said first and second conductive portions are disposed at different locations of said PCB along a length of said via, wherein said second material comprises tin, wherein said backdrilling having a second diameter, wherein the second diameter is less than or equal to a sum equal to 5 mils plus the first diameter, wherein said chemically removing step is performed by an etchant operable to etch said first material, wherein said etchant is operable to etch said first material at a first rate, wherein said etchant is operable to etch said second material at a second rate, wherein said first rate is greater than said second rate, and wherein said method further comprises maintaining a passageway free from obstruction through said via after said chemically removing step.

* * * * *